(12) United States Patent
Manansala

(10) Patent No.: US 6,924,496 B2
(45) Date of Patent: Aug. 2, 2005

(54) FINGERPRINT SENSOR AND INTERCONNECT

(75) Inventor: Michael Manansala, Santa Clara, CA (US)

(73) Assignee: Fujitsu Limited, Kawasaki (JP)

(*) Notice: Subject to any disclaimer, the term of this patent is extended or adjusted under 35 U.S.C. 154(b) by 111 days.

(21) Appl. No.: 10/160,438

(22) Filed: May 31, 2002

(65) Prior Publication Data

US 2003/0224553 A1 Dec. 4, 2003

(51) Int. Cl.[7] ............................................. G06K 11/00
(52) U.S. Cl. ..................... 250/556; 250/239; 361/760
(58) Field of Search ........................ 361/760; 250/556, 250/239

(56) References Cited

U.S. PATENT DOCUMENTS

| | | | |
|---|---|---|---|
| 4,649,418 A | 3/1987 | Uden | 257/679 |
| 5,963,679 A | 10/1999 | Setlak | 382/312 |
| 6,014,066 A | 1/2000 | Harberts et al. | 333/104 |
| 6,028,773 A | 2/2000 | Hundt | 361/760 |
| 6,307,258 B1 | 10/2001 | Crane, Jr. et al. | 257/680 |
| 6,347,040 B1 * | 2/2002 | Fries et al. | 361/760 |
| 6,672,174 B2 * | 1/2004 | Deconde et al. | 73/862.046 |
| 2002/0081780 A1 | 6/2002 | Salatino et al. | 438/127 |
| 2003/0170933 A1 | 9/2003 | Manansala | 438/116 |

FOREIGN PATENT DOCUMENTS

| | | | |
|---|---|---|---|
| WO | WO 99/60513 | * | 11/1999 |
| WO | WO-01-75962 A1 | * | 10/2001 |

* cited by examiner

*Primary Examiner*—Thanh X. Luu
(74) *Attorney, Agent, or Firm*—Sheppard Mullin Richter & Hampton LLP

(57) ABSTRACT

Flexible interconnect packaging system. The system includes a flexible substrate material that includes internal traces coupled to fingerprint sensor mounted to the substrate. Bonding pads of the fingerprint sensor are connected to conductive trace pads of the internal traces using techniques such as, wire bonding, ball/bump methods, tape automated bonding (TAB), or any other applicable bonding methodology for integrated circuits. The final package includes a pre-molded package the forms an open cavity, thereby allowing a sensor surface of the fingerprint sensor to be exposed for access by a user.

12 Claims, 6 Drawing Sheets

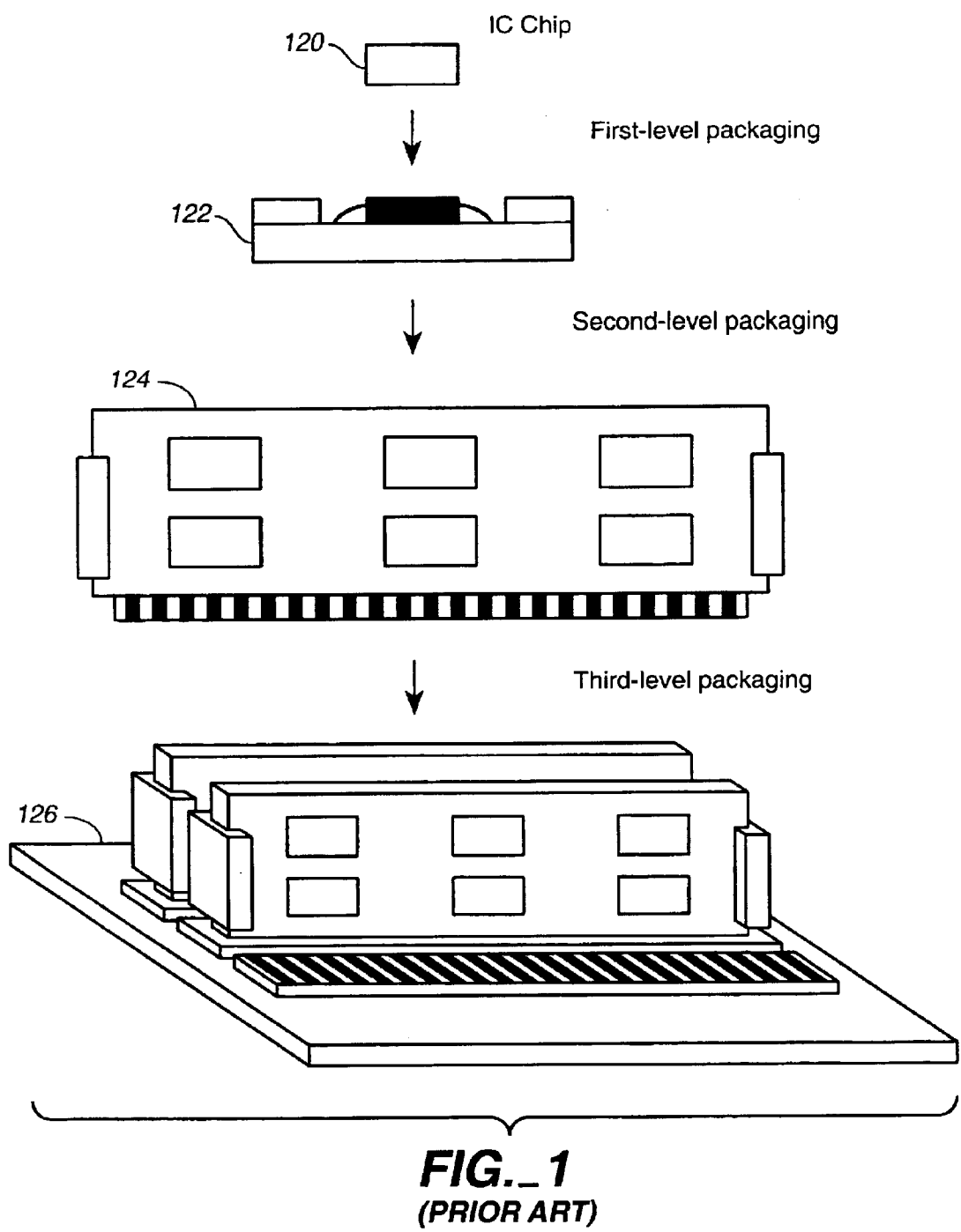
FIG._1
*(PRIOR ART)*

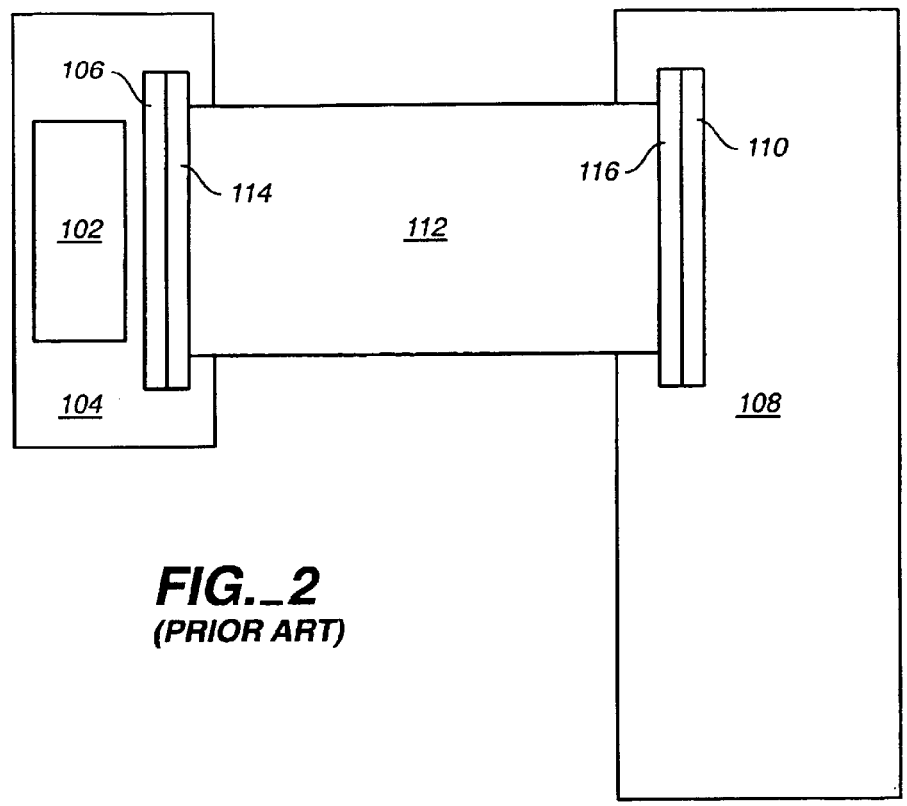
FIG._2
*(PRIOR ART)*
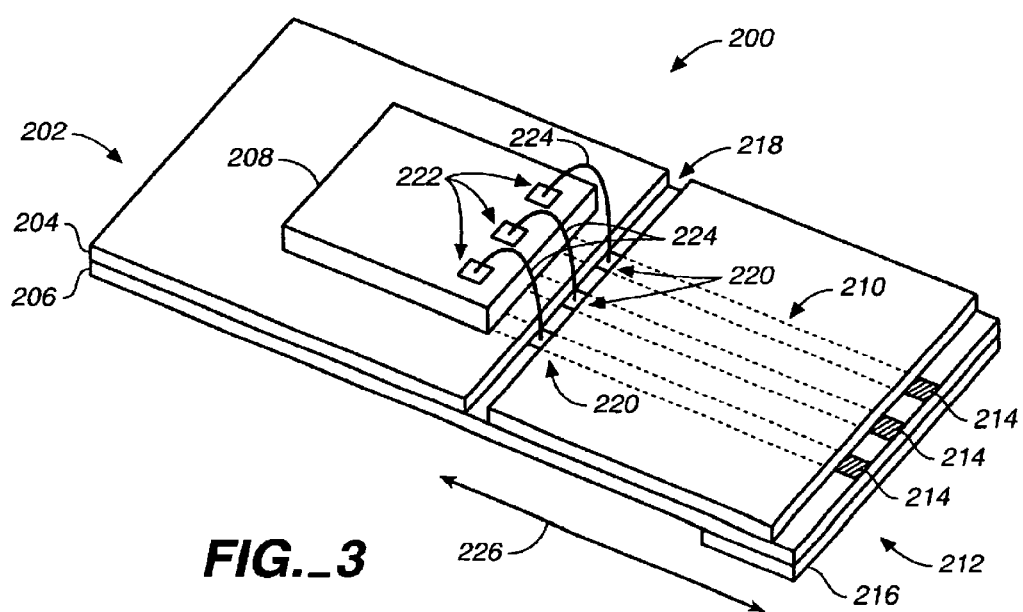
FIG._3

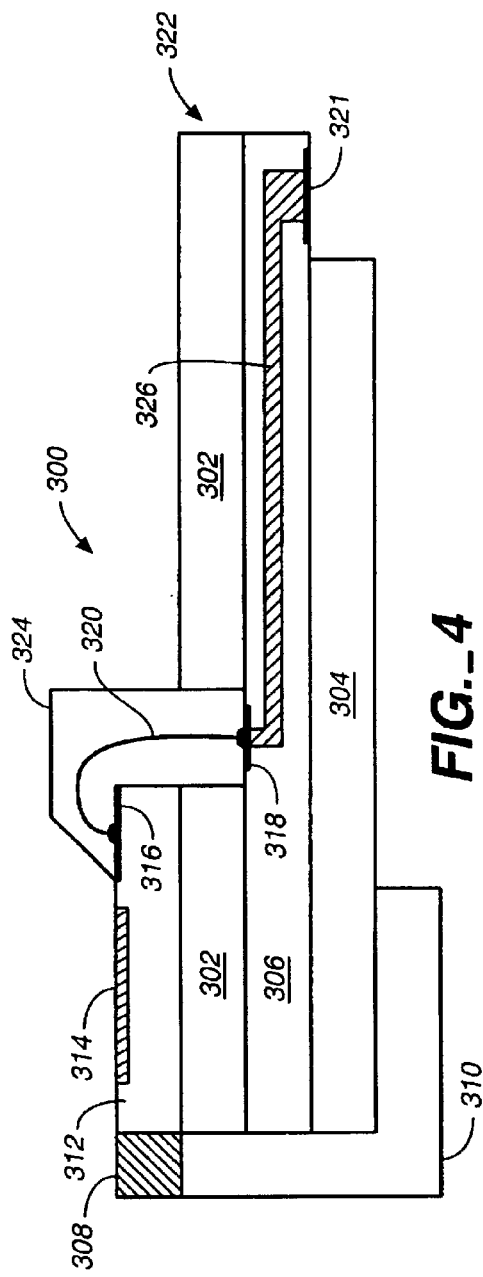
FIG._4
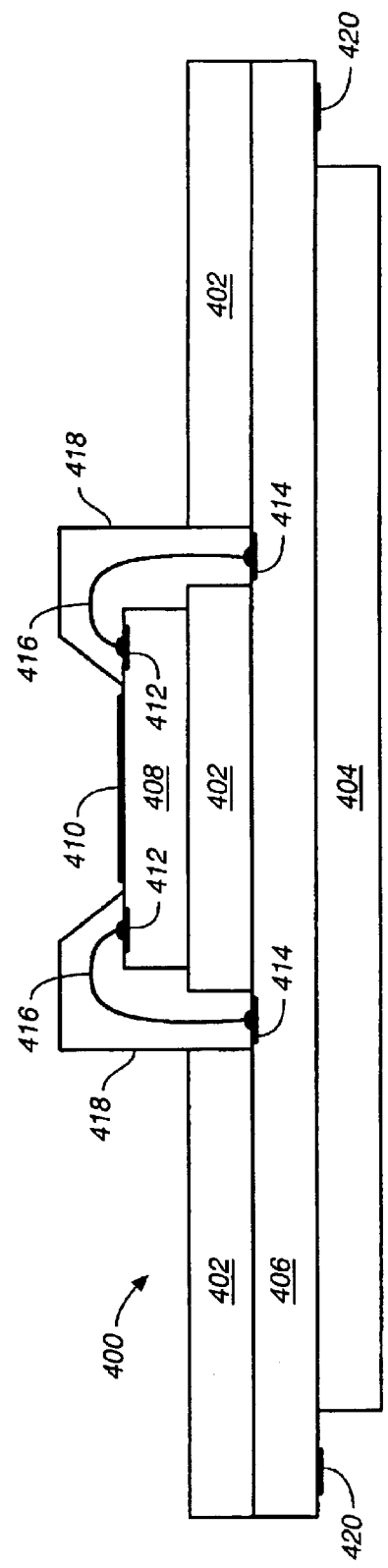
FIG._5

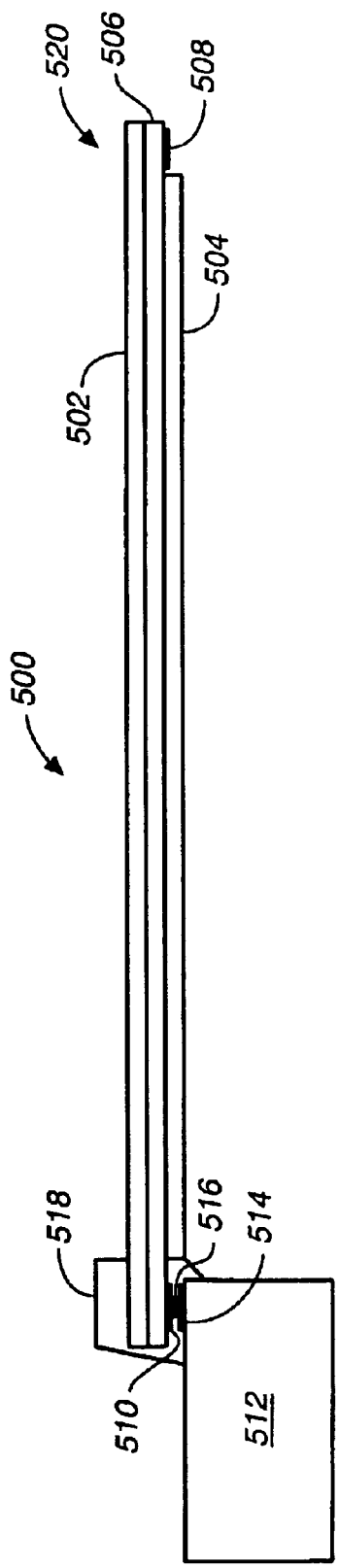
FIG._6

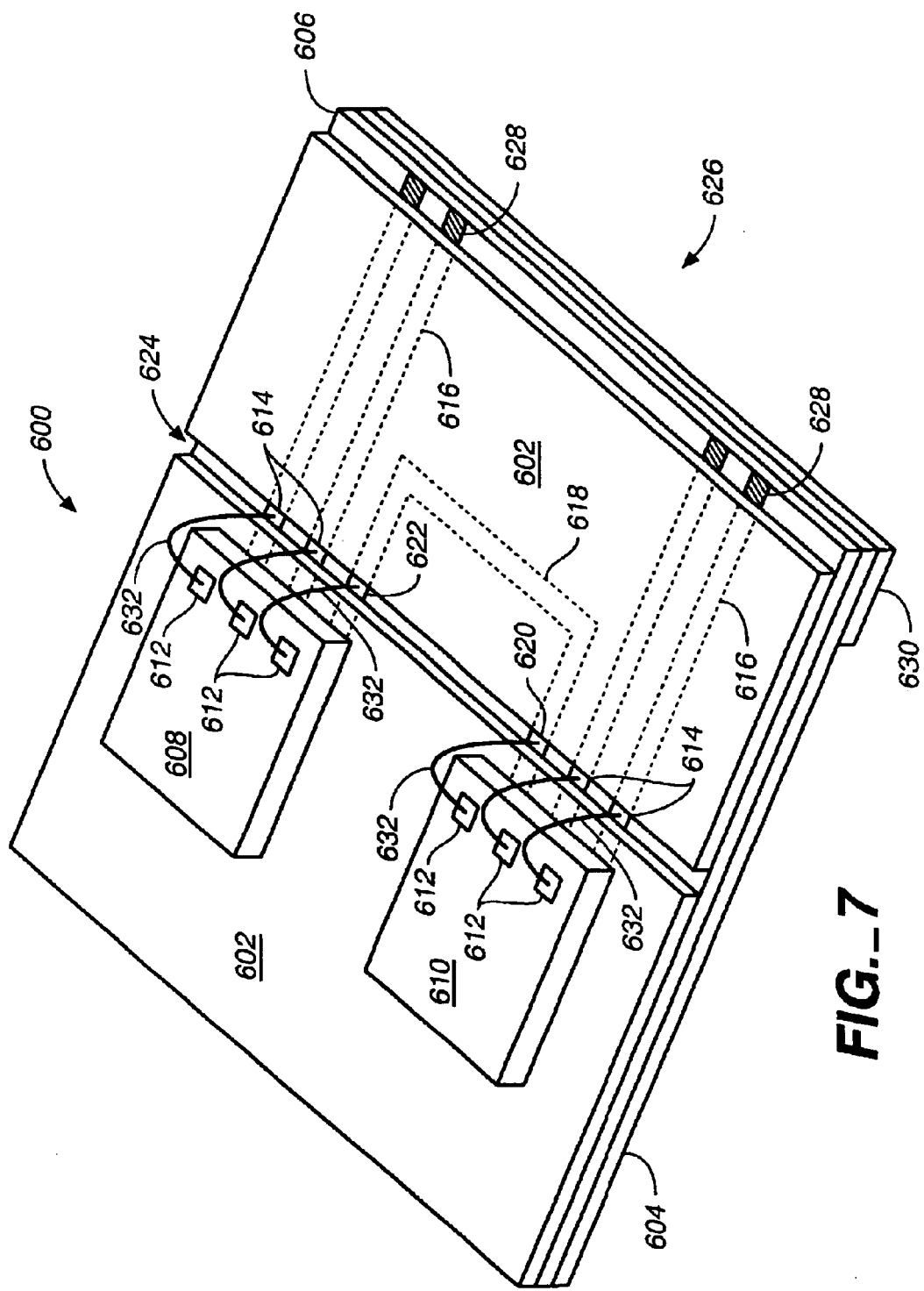
FIG._7

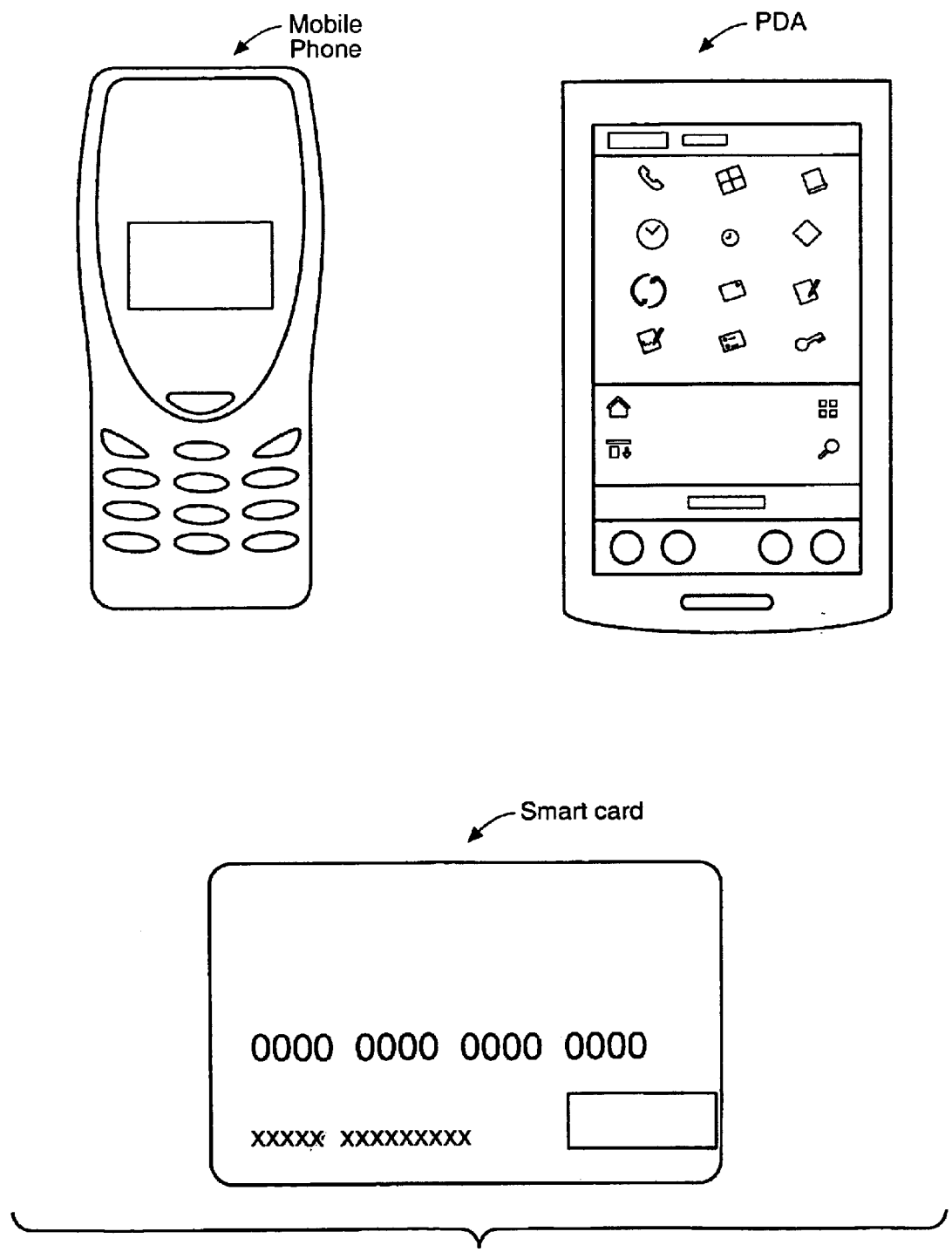
FIG._8

FINGERPRINT SENSOR AND INTERCONNECT

CROSS REFERENCE TO RELATED APPLICATIONS

This Application incorporates by reference a commonly owned U.S. Patent Application entitled "SYSTEM FOR PROVIDING AN OPEN-CAVITY LOW PROFILE ENCAPSULATED SEMICONDUCTOR PACKAGE" having Ser. No. 10/094,954 and filed on Mar. 9, 2002. The disclosure of the above-identified application is incorporated by reference in its entirety for all purposes.

FIELD OF THE INVENTION

The present invention relates to packaging systems, and more particularly, to a flexible interconnect packaging system.

BACKGROUND OF THE INVENTION

Given the reduced size of many consumer electronic devices, packaging systems are becoming increasingly important. For example, cellular telephones are becoming smaller and smaller to satisfy consumer's desires for portable lightweight telephones that are easy to carry. Such devices must still provide all the features and functions consumers require. It is typical for a cellular telephone to have a keypad, display, and a sound generator. It is anticipated that the newest telephones will include an infrared (IR) interface, video capability and a fingerprint sensor for added security. Furthermore, the progression to smaller and smaller consumer devices with advanced features is extending beyond cellular telephone technology to such technologies as Personal Digital Assistants (PDAs) and notebook computers The migration to smaller and smaller devices has placed great emphasis on the various packaging systems used to integrate the various internal system components together within the device housing. However, conventional packaging techniques make use of rigid circuit boards to secure components and to electrically coupled the components together. As a result, limitations exist as to where and how the components can be arranged within the housing and how they are presented at the external surface of the housing to the consumer.

One of the most important issues in electronic packaging is that of packaging and interconnecting integrated circuits (ICs). The ICs are the heart of electronic system controls, and since they are typically sensitive to electrical, mechanical, physical, and chemical influences, they require careful consideration by the packaging engineer. As such, IC packaging is the middle link of the process that produces today's systems.

FIG. 1 shows three levels of electronic packaging. The first level of packaging (IC packaging) is where an IC chip 120 is assembled into an IC package 122. The IC package is the housing that assures environmental protection to the IC chip, and provides for complete testing and high-yield assembly to the next level of interconnection. The IC package provides the first order of interconnection to the IC chip. The IC chip is coupled to external package pins via wire bonding, tape automated bonding (TAB), or using a flip-chip bumping method.

The second level of packaging can be described as IC package assembly onto a carrier circuit board 124. The carrier circuit board is typically made up of a single or multi-layered rigid substrate and is designed to carry the IC package to provide the next level of interconnection to a main printed circuit board (PCB) or back-plane 126.

The interconnecting joints between the IC package 122 and the carrier circuit board 124 is typically made possible via solder balls, IC sockets, and/or solder joint pads. A third level of packaging is accomplished when the carrier circuit board 124 is finally connected to the main (PCB) 126. Thus, current packaging systems provide a system of rigid packaging structures to package and interconnect electronic components.

FIG. 2 shows another conventional technique used to couple an electrical component to a main circuit board. For example, the electrical component may be a fingerprint sensor. The electrical component 102 is mounted to a small rigid printed circuit board 104 that includes a connector 106. The main circuit board 108 also includes a connector 110. An interface cable 112 couples the small circuit board 104 to the main circuit board 108. The interface cable 112 includes mating connectors 114, 116 that mate to connectors 106 and 110, respectively. Thus, the small circuit board 104 and associated connectors 106, 114 are used to couple the component 102 to the main circuit board 108.

Given the above-described packaging system it is easy to see that several limitations exist. For example, connecting the component 102 to the main circuit board 108 is expensive because it requires the small circuit board 104 on which to mount the component 102, and connectors 106, 114 to mate with the interface cable 112. Furthermore, the technique results in size and flexibility limitations because the size of the circuit board 104 and the associated connectors (106, 114) limit how and where the component 102 may be located in a housing, and how such components are presented to the user at the outside surface of the device.

Therefore, it would be desirable to have a packaging system that allows components to be coupled together without the restrictions and limitations that are present in currently available packaging systems.

SUMMARY OF THE INVENTION

The present invention includes a flexible interconnect packaging system. The system makes use of a flexible printed circuit board as the main substrate material. In one embodiment, components are mounted or attached to the substrate using standard die attachment adhesive (conductive or non-conductive). Bonding pads of the components are connected to conductive trace pads of the flexible substrate using techniques such as, wire bonding, ball/bump methods, tape automated bonding (TAB), or any other applicable bonding methodology for integrated circuits. The packaging includes a plastic transfer molding in the form of a pre-molded package that provides physical support and protection, and enables reliable connection between the component and the substrate.

Using the packaging system included in the present invention provides several advantages over convention systems. In conventional systems, IC devices generally must follow the orientation of the main circuit board. However, the packaging system included in the present invention allows the circuit to bend, thus providing a way for devices to be placed in virtually any orientation. For example, a component may be located away from a main circuit board and orientated in virtually any orientation with regards to the main circuit board. For example, the component may be a fingerprint sensor that is used in a cell phone. The packaging system included in the present invention allows the fingerprint sensor to be located away from the main circuit board and orientated and exposed at an outside surface of the cell phone to provide the best sensor position for use by the cell phone user.

Furthermore, the packaging system allows devices to be coupled to the main circuit board via a single socket connector located on the circuit board, thereby providing easy access and quick connect and disconnect of the device from the circuit. This allows easy replacement by the user without the need to return the device to the manufacturer. The packaging system is applicable to all types of electronic devices, optical devices, touch/pressure devices and any other type of sensor or electrical component.

Thus, the limitations on sensor placement onto a given enclosure (cell phone, PDA and etc.) has been eliminated. For example, with the advantages offered by one or more embodiments of the present the invention, cell phone designers now have freedom to select the mounting location for sensor components at any location on the enclosure. Due to the easy connection and disconnection of the packaging system from the main circuit board, the sensor can be replace either by the end user or at a field service location. Thus, the device does not have to be returned to a service center and users do not have to wait for days to repair the device.

In one embodiment included in the present invention, a flexible interconnect apparatus is provided for coupling to an electrical component. The electrical component has at least one contact pad and the interconnect apparatus comprises a flexible substrate, and at least one conductive trace in the flexible substrate, wherein the at least one conductive trace has an exposed contact region that is directly electrically coupled to the at least one contact pad.

In another embodiment of the present invention, a flexible interconnect apparatus is provided for flexibly coupling a fingerprint sensor to an external circuit. The interconnect apparatus includes a flexible substrate having one or more conductive traces that form a connector at one end. The connector mates with a corresponding connector that is coupled to the external circuit. A fingerprint sensor is attached to the substrate and has a sensor surface. The fingerprint sensor has sensor contacts that are wire-bonded to the conductive traces. The apparatus also includes a molded package coupled to a bottom portion of the substrate below the fingerprint sensor, the molded package forming an open top cavity that allows the sensor surface of the fingerprint sensor to be exposed for access by a user.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 1 shows three levels of electronic packaging;

FIG. 2 shows a diagram of a conventional packaging system;

FIG. 3 shows a diagram of one embodiment of a flexible interconnect packaging system constructed in accordance with the present invention;

FIG. 4 shows a side view of one embodiment of a packaging system constructed in accordance with the present invention;

FIG. 5 shows a diagram for a third embodiment of a flexible interconnect packaging system constructed in accordance with the present invention;

FIG. 6 shows a diagram for a fourth embodiment of a flexible interconnect packaging system constructed in accordance with the present invention;

FIG. 7 shows a diagram for a fifth embodiment of a flexible interconnect packaging system constructed in accordance with the present invention; and FIG. 8 shows three devices that use a flexible interconnect packaging system in accordance with the present invention.

DETAILED DESCRIPTION OF THE INVENTION

The present invention includes a flexible interconnect packaging system that overcomes the limitations of conventional packaging systems. For example, in one embodiment, a flexible packaging system is provided that includes a flexible substrate and a pre-molded or post-assembly molded plastic package that forms an open cavity for receiving a fingerprint sensor. Such a flexible packaging system can be used within the housing of a cellular telephone, or other portable electronic device, to provide the sensor at an outside surface of the device housing, while electrically coupling the sensor to an internal circuit board that has an orientation that is different from the sensor's orientation.

The packaging system as described above fits into very small form factor devices and is producible at a relatively low cost. Furthermore, the packaging system is easily replaceable in case of damage to the sensor. For example, the fingerprint sensor may be damaged by a hard material such as a key or coins as they are being carried within the same pocket that the is carrying the cell phone.

Exemplary Embodiments

FIG. 3 shows a diagram of one embodiment of a flexible interconnect packaging system 200 constructed in accordance with the present invention. The system 200 includes a substrate material, shown generally at 202. The substrate 202 is comprised of a top substrate portion 204 and a bottom substrate portion 206. An electronic component 208 is shown affixed to the top substrate portion 204. In one embodiment, the component 208 is affixed to the substrate 204 using a high temperature die attachment epoxy (conductive or non-conductive). In another embodiment, the component 208 is affixed using a conductive or non-conductive high temperature adhesive tape. However, any suitable attachment means may be used to affix the component 208 to the substrate 204.

A set of conductive traces, shown generally at 210, is located between the top 204 and bottom 206 substrate portions. The conductive traces transmit electrical signals between the component 208 and an edge connector 212. The edge connector 212 is constructed to connect to a mating connector (not shown) that is located on a main circuit board. The conductive traces are comprised of copper or other suitable conductive material. In one embodiment, the traces are laminated between the top and bottom substrate portions. However, other processes may be used to incorporate conductive traces with the substrate. For example, it is possible to embed conductive traces into a single substrate portion.

In the embodiment shown in FIG. 3, there exists only one layer of conductive traces. However, it is possible to incorporate multiple layers of conductive traces, where each layer is separated and/or isolated by additional substrate material or other suitable flexible material. Thus, it is possible to create complex circuits that route signals using multiple layers of conductive traces that have conductive vias to electrically couple traces on different layers.

At the edge connector 212, the top substrate portion is partially removed to expose contact regions 214 of the conductive traces. The contact regions 214 mate with corresponding contact regions of the mating connector to allow electrical signals to be transmitted from the packaging system 200 to the main circuit board. The contact regions may be gold plated if desired. The edge connector 212 includes a stiffener 216 that is attached to the bottom substrate portion 206 under the contact regions 214. The stiffener operates to reinforce the edge connector and keep it in a relatively flat or straight alignment.

The top substrate portion also includes a break where a section of the top substrate is removed, as shown at 218. The removed section of the top substrate 204 exposes regions of the traces 210 that are referred to as trace pads 220. The removed section of the top substrate portion is located in close proximity to the component 208.

The component 208 includes contact pads 222 that are coupled to the internal circuitry of the component 208 and are used to interface the component to other circuits. In one embodiment of the invention, bonding wires 224 are bonded between the contact pads 222 and the trace pads 220. The bonding wires are connected using typical bonding techniques. Wire bonding technology is the preferred method for device interconnection for several reasons. First, bonding wires are low cost since the cost of gold wire per connection is the lowest compared to any interconnection method. Second, gold wires are flexible and can be shaped or profiled according to a desired looping sequence, loop height, or other shape that other technologies can not offer. Third, bonding pads can be plated. The copper pads on the flexible substrate are very well suited for gold plating or deposition. This allows 100% compatibility with the gold wire so that gold to gold bonding accomplished through a thermosonic process is very reliable. Lastly, bonding machines are readily available, since they are standard machines available at any given assembly foundry and the processes are standard and low cost, whereby unlimited volume demand can be supported.

In order to withstand the temperature requirements of the bonding process, the flexible substrate portions 204 and 206 are comprised of a high temperature substrate material. In one embodiment, the substrate portions are comprised of a polyimide material. For example, the polyimide material may be a material known as "Kapton" that has a service temperature range of approximately −200 to +300 degrees Celsius. Another material that is suitable for use as the flexible substrate portions 204 and 206 is referred to as "Adhesiveless Kapton." This material has a service temperature range of approximately −200 to +350 degrees Celsius. However, the flexible substrate material is not limited to the above-identified materials and may be comprised of any flexible material having a service temperature that can withstand the wire bonding process or solder processes. Thus, in one embodiment, the flexible substrate material is basically a polyimide substrate base material with laminated layer(s) of copper traces for interconnection between a silicon device and the external edge contacts.

After the bonding wires are installed, an encapsulation (not shown in FIG. 3) is provided to cover and protect the bonding wires 224, the contact pads 222, and the trace contacts 220. The encapsulation is discussed in more detail in another section of this document. Furthermore, the packaging system of FIG. 3 is not shown to scale since the portion of the packaging system shown at 226 may be much longer than shown, thereby allowing the component to be located at varying distances from the edge connector 212. This allows for the packaging system to provide the most flexibility since the substrate portions are flexible and allow for bending and twisting so that the component 208 can be orientated as desired independently from the orientation of the edge connector 212.

FIG. 4 shows a side view of one embodiment of a packaging system 300 constructed in accordance with the present invention. The packaging system 300 includes top and bottom substrate portions 302 and 304, respectively. The system 300 also includes a conductive trace region 306, an electrostatic discharge region 308 and a pre-molded package 310.

The packaging system 300 includes a sensor component 312. In one embodiment, the sensor component is a fingerprint sensor and includes a sensor region 314 and one or more sensor contacts 316. The one or more sensor contacts 316 allow data obtained from the sensor region to be transmitted to another circuit. The sensor component may also comprise other types of IC sensors as desired.

The conductive trace region 306 includes one or more conductive traces 326 that have one or more trace contacts 318. For example, the top substrate portion 302 includes an opening that exposes the one or more trace contacts. The sensor contacts and the trace contacts are coupled together with bonding wires 320. As a result, signals from the fingerprint sensor are transmitted via the bonding wires 320 from the sensor contacts 316 to the trace contacts 318 for transmission over the conductive traces 326.

The conductive traces 326 include edge contacts 321 that form part of an edge connector 322 that allows the packaging system 300 to be coupled to a mating connector that is part of another circuit. Thus, it is possible for signals from the fingerprint sensor to be transmitted to another circuit via the edge connector. The edge connector 322 may also include a stiffener (not shown in FIG. 4) to support the alignment of the edge connector 322.

The pre-molded package 310 solves various limitations and problems that might occur in the actual packaging process. Due to the added stiffening support provided by the package 310 underneath the flexible substrate, the total chip bonding surface area and bondable trace contact 318 are well supported. This operates to counter any flexing action that may occur during the bonding process, and thereby avoid severe packaging and/or assembly quality problems such as those described below.

A) Wire bonding defects and failures encountered in wire bonding to a flexible substrate due to its material surface "softness" as compared to other conventional hard substrate material like metal lead-frame and organic substrate PC boards. For example, when a capillary wire bonding tool touches the flexible substrate bonding pads, in order to make a complete wire bond interconnect from the silicon chip bond pads, the softness of the flexible substrate inherently experience "bouncing" action from the tip of the wire bond capillary. This phenomena is called a "bouncing capillary" and would thereby result in wire bonding imperfections and quality defects known in various degrees and forms, such as broken wire, non-stick on pad, smashed ball bond, over sized ball, or undersized ball and etc.

B) Handling problems while in packaging assembly process where the device is mounted onto the flexible substrate without any reinforcement or stiffener materials such as described in this invention. Danger of damaging the device due to accidental bumps, shocks, or miscarriage of the single strip or many strips of devices attached onto the flexible substrate may potentially suffered deformation, bending and crumple the flexible substrate. Thus, several quality defects related to handling and miscarriage of the devices may directly result in reliability failures of the devices.

The pre-molded package included in the present invention operates to reduce or eliminate the above-identified defects so that reliable connection between the device and the substrate is achieved. The pre-molded package 310 achieves this result by providing support to the bottom and side of the substrate material. In effect, the pre-molded package 310 provides an open cavity that allows the component to be mounted on the top portion of the substrate. By providing this open cavity, the component may be a sensor device, such as a fingerprint sensor, that reads user data when touched by a user. Mounting such a sensor would not be possible where the pre-molded package fully encapsulates the substrate material so that there would be no access to the sensor surface.

Also included in the packaging system 300 is an encapsulation region 324 that covers and protects the bonding wires 320, the sensor contacts 316, and the trace contacts 318. The encapsulation 324 may comprise a plastic epoxy material (glob top, molded, etc.) or other suitable material. Thus, the packaging system 300 provides a way to package a fingerprint sensor 312 using a flexible substrate, and to electrically coupled the sensor to another circuit without the use of a separate circuit board and additional interface connectors. The length of the substrate 302, 304 and contact 306 regions may be selected to accommodate folding and twisting to orientate the fingerprint sensor to a desired position independent from the orientation of the edge connector 322.

In accordance with the invention, the packaging system 300 has the advantage of providing an assembled sensor package ready for mounting in a final product assembly application (i.e., cell phone, PDA, remote key lock, etc.). Since the construction of the package includes reinforcements built around the sides and bottom surface of the fingerprint sweep sensor device, the final mounting can be easily located and fixed onto any part of a given enclosure of the device. For example, the pre-molded package can be fastened, secured, or snapped into a slot provided in the device housing allowing the sensor surface to be exposed on the enclosure. The unique construction of the pre-molded package allows the use of the fingerprint sensor in the packaging system, since the package provides an "open top cavity" molding process that results in access to the sensor, instead of a complete encapsulation of the device, which would not allow access to the sensor.

FIG. 5 shows a diagram for another embodiment of a flexible interconnect packaging system 400 constructed in accordance with the present invention. The system 400 includes top 402 and bottom 404 substrate portions and a conductive trace region 406. The system 400 is used to flexibly package a fingerprint sensor component 408 that has a sensor region 410 and sensor contacts 412. Trace contacts 414 are exposed by a break in sections of the top substrate portion 402.

Bonding wires 416 are used to couple the sensor contacts 412 to the trace contacts 414. An encapsulation material 418 is used to cover and protect the bonding wires and the associated contacts. Conductive contacts 420 are provided so that signals from the fingerprint sensor 408 may be transmitted via the sensor contacts 412, bonding wires 416 and trace contacts 414, through the conductive contacts 420 to an external circuit.

FIG. 6 shows a diagram for another embodiment of a flexible interconnect packaging system 500 constructed in accordance with the present invention. In this embodiment, a gold ball bump technique is used to couple a fingerprint sensor component to a flexible interconnect package.

The system 500 includes flexible substrate portions 502 and 504 that surround a conductive trace region 506. The trace region 506 includes trace contacts shown at 508 and 510. The trace region includes internal conductive traces that couple together corresponding trace contacts. For example, one conductive trace couples together one trace contact shown at 510 with one trace contact shown at 508.

A component 512 mounted to the flexible packaging includes a component contacts 514. The component contacts 514 are coupled to the trace contacts 510 using a conductive ball 516 technique. An encapsulation 518 is used to cover the component and trace contacts and to reinforce the attachment of the component to the flexible package.

The flexible packaging system 500 forms an edge connector as shown at 520. In one embodiment, the edge connector 520 is reinforced with a stiffener (not shown). The edge connector 520 connects to a mating connector coupled to an external circuit. For example, the mating connector may be on a main circuit board that includes a main processing circuit. Signals transmitted from the component via the component contacts and the conductive traces are input to the external circuit through the edge connector. Since the packaging system 500 is flexible, the substrate portions 502, 504 and the conductive trace region 506 may be folded, bent or twisted to allow the component 512 to be orientated in virtually any orientation with respect to the main circuit board. Thus, the component location within a housing (i.e., a cellular telephone housing) is not restricted by the location or orientation of the main circuit board. Furthermore, since the flexible packaging system 500 does not require a small circuit board to couple to the component, additional size, space and cost savings are realized.

FIG. 7 shows a diagram for another embodiment of a flexible interconnect packaging system 600 constructed in accordance with the present invention. FIG. 7 illustrates how the flexible packaging system may comprise multiple components that are interconnected within the packaging system itself.

The system 600 comprises top 602 and bottom 604 flexible substrate portions that surround a flexible conductive trace region 606. Components 608 and 610 are attached to the top substrate 602. The components include component contacts 612 that are used to transmit information signals from the components.

The conductive trace region 606 includes conductive traces 616 that are used to carry signals from the components to an edge connector, shown generally at 626. A portion of the top substrate is removed, as shown at 624, to expose trace pads 614 of the conductive traces.

In the system 600, a conductive trace 618 is shown that couples together trace pad 620 to trace pad 622. The trace pads (614, 620, 622) are coupled to the contact pads 612 via bonding wires 632. Signals flowing to and from the components flow through the bonding wires.

With regards to trace 618, this trace operates to couple signals between the components 608 and 610. For example, a signal transmitted from component 608 via trace pad 622 flows to component 610 via trace pad 620. Thus, the flexible packaging provided in accordance with the present invention operates to route signals between multiple components. It is therefore possible to mount multiple components on a flexible interconnect package and route signals between those components to perform specific functions. For example, it is possible to mount a microphone component and it associated pre-amp circuitry onto flexible interconnect packaging constructed in accordance with the present invention. Thus, the flexible microphone package may be easily coupled or uncoupled from a main circuit board, for example, within a cellular telephone housing. The flexible packaging allows the microphone to be located anywhere in the housing without regard to the orientation of the main circuit board.

FIG. 8 shows three devices that use a flexible interconnect packaging system in accordance with the present invention. For example, a packaging system as described in any of the above embodiments may be used to couple a fingerprint sensor to a main circuit board within a cell phone, a PDA, and a smart card. In all these devices, the flexible interconnect packaging allows the sensor to be orientated independently from the main circuit board so that it is possible to achieve a desired presentation to the user at the outside surface of the device.

In one embodiment, a pre-molded package is included with a flexible packaging system to mount a fingerprint sensor on a cell phone housing. The pre-molded package operates to support a flexible substrate during the wire bonding process that bonds the fingerprint sensor to the flexible substrate. The pre-molded package includes an open top cavity that allows the fingerprint sensor to be mounted to the flexible substrate while maintaining user access to a sensor surface of the fingerprint sensor. Thus, the flexible packaging system allows the fingerprint sensor to be mounted at virtually any location on the cell phone housing and have its sensor surface exposed for access by a user. The flexible substrate allows the fingerprint sensor to be mounted independent of its orientation with respect to a main internal circuit board to which it is connected.

The present invention includes a flexible interconnect packaging system. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. A flexible interconnect apparatus for flexibly coupling a fingerprint sensor to an external circuit, comprising:
   a multilayer flexible substrate having conductive traces that lead to a connector at one end of said substrate for connecting to an external circuit;
   a fingerprint sensor mounted on an end portion of the multilayer flexible substrate distal from said connector end and having a sensor surface, the fingerprint sensor having sensor contacts that are connected to the conductive traces; and
   a molded package coupled to a portion of the bottom of the multilayer flexible substrate below the fingerprint sensor such that at least a portion of the multilayer flexible substrate is positioned between the fingerprint sensor and the molded package, the molded package forming an open top cavity that allows the sensor surface of the fingerprint sensor to be exposed for access by a user, such that the portion of said interconnect apparatus proximate said molded package is rigid, and the portion of said interconnect apparatus distal from said molded package is flexible.

2. The apparatus of claim 1, wherein the flexible interconnect apparatus is mounted to a housing for a cellular telephone so that the surface of said fingerprint sensor is exposed at an outside surface of the housing, and wherein the connector is connected to an external circuit located on a main PCB within the housing.

3. The apparatus of claim 2 wherein the orientation of the fingerprint sensor is different than the orientation of the main PCB within the housing.

4. The apparatus of claim 1, wherein said flexible substrate has sufficient flexibility to be folded.

5. The apparatus of claim 1, wherein said flexible substrate has sufficient flexibility to be twisted.

6. The apparatus of claim 1 further comprising a stiffener coupled to said flexible substrate at the connector end thereof.

7. The apparatus of claim 1 wherein said conductive traces are formed in a conductive layer that is internally positioned within said multilayer flexible substrate, and a portion of said multilayer flexible substrate has a cavity formed in one or more of the layers thereof adjacent to said fingerprint sensor, said cavity in said multilayer flexible substrate extending to and exposing a corresponding portion of said conductive layer, and further comprising wires connecting said sensor contacts to said conductive layers within said cavity in said multilayer flexible substrate.

8. The apparatus of claim 7 further comprising an encapsulation material filling said cavity in said multilayer flexible substrate and covering said wires.

9. The apparatus of claim 1 wherein said molded package surrounds only a portion of said fingerprint sensor.

10. A fingerprint sensing apparatus, comprising:
   an elongate multilayer flexible substrate having a conductive layer comprising a plurality of conductive traces;
   a fingerprint sensor mounted on top of said elongate multilayer flexible substrate proximate a first end thereof; said fingerprint sensor having a sensor surface and a plurality of electrical contacts which are connected to conductive traces in said conductive layer at a location removed from said first end;
   a frame mounted below a portion of said elongate multilayer flexible substrate adjacent said first end, such that at least a portion of said elongate multilayer flexible substrate is between said frame and said sensor, and such that said sensor surface is exposed and the portion of said elongate multilayer flexible substrate proximate said frame is rigid;
   a connector at a second end of said elongate multilayer flexible substrate distal from said first end, said connector having a plurality of electrical contacts coupled to said conductive traces;
   such that a major portion of said elongate multilayer flexible substrate between said frame and said connector is free to flex.

11. The fingerprint sensing apparatus of claim 10 further comprising a stiffener for providing rigidity to said connector.

12. The fingerprint sensing apparatus of claim 10 wherein said frame surrounds only a portion of said fingerprint sensor.

* * * * *